United States Patent
Park et al.

(10) Patent No.: US 10,957,675 B2
(45) Date of Patent: Mar. 23, 2021

(54) LIGHTING-EMITTING DEVICE FILAMENT

(71) Applicant: SEOUL SEMICONDUCTOR CO., LTD., Gyeonggi-do (KR)

(72) Inventors: Jae Hyun Park, Gyeonggi-do (KR); Seong Jin Lee, Gyeonggi-do (KR); Jong Kook Lee, Gyeonggi-do (KR)

(73) Assignee: SEOUL SEMICONDUCTOR CO., LTD., Gyeonggi-do (KR)

( * ) Notice: Subject to any disclaimer, the term of this patent is extended or adjusted under 35 U.S.C. 154(b) by 0 days.

(21) Appl. No.: 16/823,949

(22) Filed: Mar. 19, 2020

(65) Prior Publication Data
US 2020/0219857 A1  Jul. 9, 2020

Related U.S. Application Data

(63) Continuation of application No. PCT/KR2018/013156, filed on Nov. 1, 2018.

(30) Foreign Application Priority Data

Nov. 10, 2017 (KR) .................. 10-2017-0149894

(51) Int. Cl.
*F21V 3/00* (2015.01)
*H01L 25/075* (2006.01)
(Continued)

(52) U.S. Cl.
CPC .......... *H01L 25/0753* (2013.01); *F21K 9/232* (2016.08); *H01L 23/5387* (2013.01);
(Continued)

(58) Field of Classification Search
CPC ............. H01L 25/075; H01L 25/0753; H01L 23/5387; H01L 23/562; H01L 33/22; H01L 33/50; H01L 33/62; H01L 33/54; H01L 33/58; H01L 33/36; H01L 2933/0091; F21K 9/232; H05K 2201/0154; H05K 2201/0145; H05K 2201/10106
(Continued)

(56) References Cited

U.S. PATENT DOCUMENTS

2004/0008525 A1* 1/2004 Shibata ................... F21K 9/232
                                                                313/271
2013/0058080 A1* 3/2013 Ge ......................... F21V 19/005
                                                                362/231
(Continued)

FOREIGN PATENT DOCUMENTS

JP    2014026757    2/2014
KR   1020110043992  4/2011
(Continued)

OTHER PUBLICATIONS

International Search Report for International Application PCT/KR2018/013156, dated Feb. 25, 2019.

*Primary Examiner* — Ali Alavi
(74) *Attorney, Agent, or Firm* — Burris Law, PLLC

(57) ABSTRACT

A light emitting device filament includes a substrate having a first surface and a second surface opposite to the first surface and extending in one direction, at least one light emitting device chip disposed on the first surface, and an auxiliary pattern disposed on the second surface and disposed at a position corresponding to the light emitting device chip.

22 Claims, 11 Drawing Sheets

(51) Int. Cl.
- *F21K 9/232* (2016.01)
- *H01L 23/538* (2006.01)
- *H01L 23/00* (2006.01)
- *H01L 33/22* (2010.01)
- *H01L 33/50* (2010.01)
- *H01L 33/62* (2010.01)

(52) U.S. Cl.
CPC ............ *H01L 23/562* (2013.01); *H01L 33/22* (2013.01); *H01L 33/50* (2013.01); *H01L 33/62* (2013.01); *H01L 2933/0091* (2013.01)

(58) Field of Classification Search
USPC ........................................................ 362/363
See application file for complete search history.

(56) References Cited

U.S. PATENT DOCUMENTS

| | | | |
|---|---|---|---|
| 2013/0235592 A1* | 9/2013 | Takeuchi | F21V 23/001 362/363 |
| 2014/0369036 A1* | 12/2014 | Feng | F21K 9/23 362/223 |
| 2015/0349201 A1* | 12/2015 | Lee | H01L 33/24 257/79 |
| 2016/0363267 A1* | 12/2016 | Jiang | F21V 29/70 |
| 2017/0051878 A1* | 2/2017 | Jiang | H01L 25/0753 |
| 2017/0084809 A1* | 3/2017 | Jiang | H01L 33/56 |
| 2017/0130906 A1 | 5/2017 | Jiang et al. | |
| 2017/0179352 A1* | 6/2017 | Song | H01L 33/62 |

FOREIGN PATENT DOCUMENTS

| KR | 1020170103068 | 9/2017 |
|---|---|---|
| KR | 1020170119503 | 10/2017 |

\* cited by examiner

LIGHTING-EMITTING DEVICE FILAMENT

CROSS-REFERENCE OF RELATED APPLICATIONS

The present application is a continuation of PCT Application No. PCT/KR2018/013156 filed Nov. 1, 2018, entitled "LIGHT EMITTING DIODE FILAMENT," which claims priorities and the benefits of Korean Patent Application No. 10-2017-0149894 entitled "LIGHT EMITTING DIODE FILAMENT" filed on Nov. 10, 2017. The contents of each application noted above are incorporated by reference in their entirety.

TECHNICAL FIELD

Various embodiments disclosed in the present disclosure relate to a light-emitting device filament used as a light source, and more particularly, relate to a filament-type light source including a light emitting device like a light emitting diode.

BACKGROUND

Conventionally, a light bulb employing a filament as its light source is being used. The light bulb is being gradually replaced with a light emitting device, such as a light emitting diode, as the light bulb has low light amount and high power consumption. When the light emitting device is used, the light emitting device can be made to use the shape and the look of a conventional filament bulb for a decorative purpose. In other words, the light emitting device may be designed to have the same shape as a conventional filament bulb.

However, in the case where the light source having the same shape as the conventional filament bulb is manufactured using the light emitting device, the light emitting device may not work properly when the filament is bent.

SUMMARY

Various embodiments disclosed in the present disclosure provide a reliable light emitting device filament.

A light emitting device filament according to various embodiments of the present disclosure includes a substrate including a first surface and a second surface opposite to the first surface and extending in one direction, at least one light emitting device chip disposed on the first surface, an electrode pad disposed at at least one end of both ends of the substrate, a connection line connecting the light emitting device chip and the electrode pad, an auxiliary pattern disposed on the second surface and disposed at a position corresponding to the light emitting device chip, and a first insulating layer disposed on the first surface and covering the light emitting device chip.

The substrate has a flexibility. The auxiliary pattern has a hardness greater than the substrate. The substrate and the auxiliary pattern include a polymer, a metal, or a metal alloy. The light emitting device chip overlaps the auxiliary pattern when viewed in a plane.

The auxiliary pattern has an area equal to or greater than an area of the light emitting device chip when viewed in a plane. The auxiliary pattern has an area smaller than an area of the light emitting device chip when viewed in a plane.

The first insulating layer is a light conversion layer that converts a wavelength of a light emitted from the light emitting device chip. The light conversion layer includes a fluorescent material.

The light emitting device filament further includes a second insulating layer disposed on the second surface and covering the auxiliary pattern.

The light emitting device chip is provided in plural, and the light emitting device chips are arranged in at least one row along a longitudinal direction of the substrate.

When the light emitting device chips are arranged in plural rows along the longitudinal direction of the substrate, the light emitting device chips do not overlap each other in a width direction.

The connection line is bent at least once. The light emitting device chips are connected to each other in series or in parallel, at least some of the light emitting device chips are connected in series, and the other light emitting device chips are connected in parallel.

The electrode pad is disposed on the first surface.

The light emitting device filament further includes an additional line connected to the electrode pad by a conductive adhesive.

The light emitting device chip is a flip chip type.

The light emitting device chip includes a device substrate, a light emitting device disposed on the device substrate, and a contact electrode disposed on the light emitting device, and the device substrate is a light transmissive substrate that scatters or disperses a light from the light emitting device. The device substrate is a patterned sapphire substrate.

The present disclosure includes a bulb-type light source employing a light emitting device filament, and the bulb-type light source includes a transparent globe and at least one light emitting device filament disposed in the globe.

Other aspects, advantages, and salient features of the present disclosure will become apparent to those skilled in the art from the following detailed description, which, taken in conjunction with the annexed drawings, discloses various embodiments of the present disclosure.

According to an exemplary embodiment of the present disclosure, the light emitting device filament which prevents or reduces the desorption or separation of the light emitting device from the substrate is provided.

DETAILED DESCRIPTION OF EMBODIMENTS

Figure 1A:
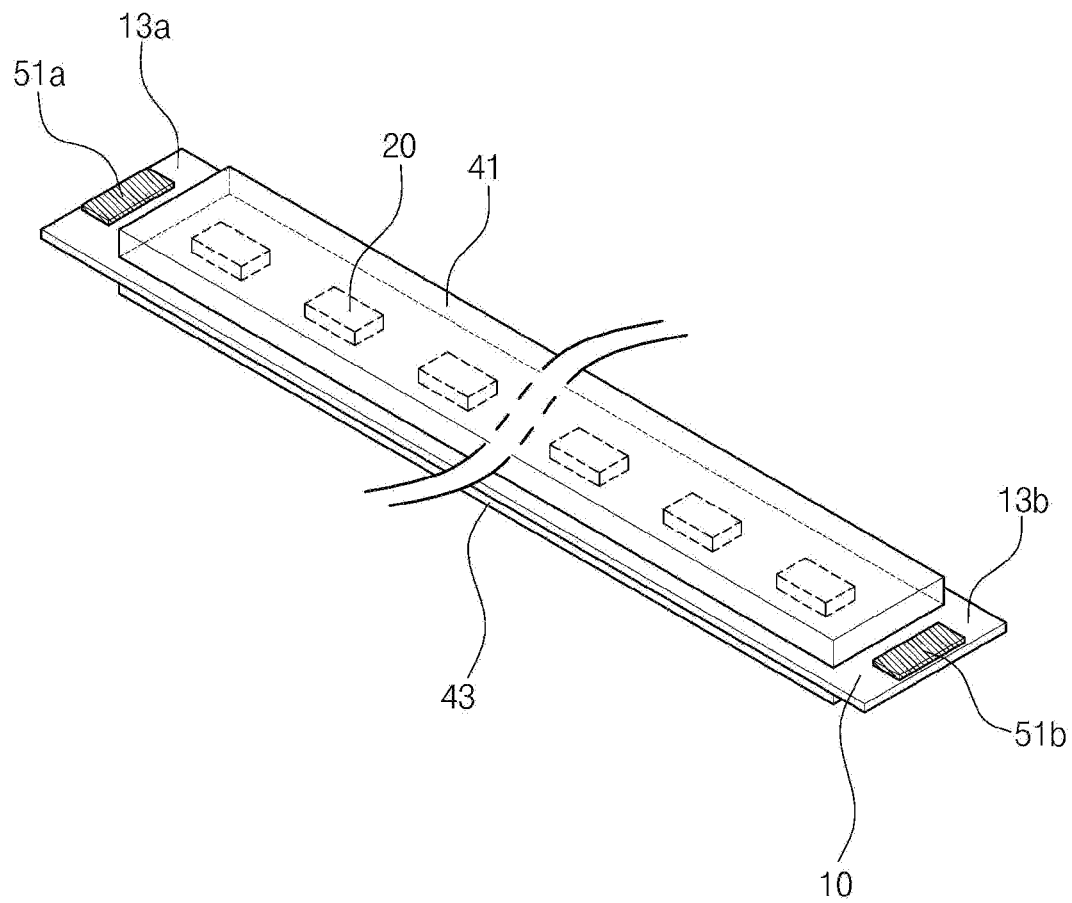
FIG. 1A is a perspective view showing a light emitting device filament according to embodiments of the present disclosure.

The present disclosure may be variously modified and realized in many different forms, and specific embodiments will be exemplified in the drawings and described in detail hereinbelow. However, the present disclosure should not be limited to the specific disclosed forms, and it should be construed to include all modifications, equivalents, or replacements included in the spirit and scope of the present disclosure.

Hereinafter, embodiments of the present disclosure will be described in detail with reference to accompanying drawings.

Figure 1B:
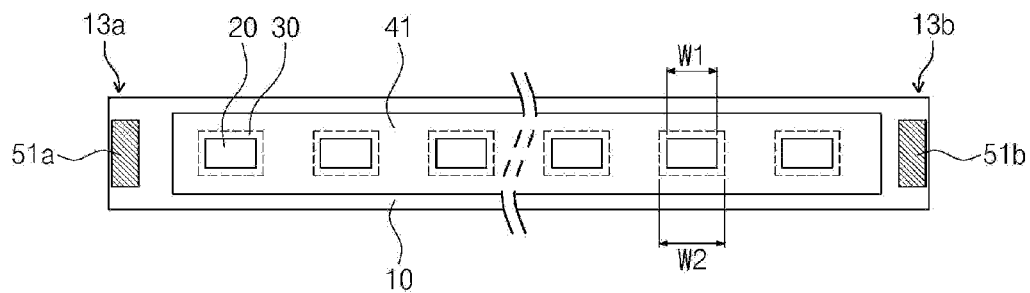
FIG. 1B is a plan view showing the light emitting device filament of FIG. 1A.
Figure 1C:
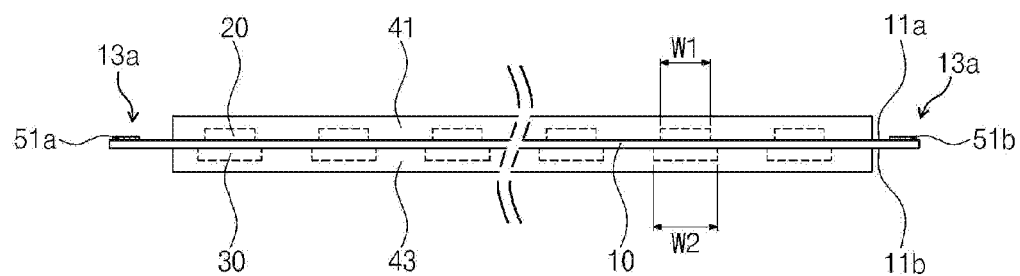
FIG. 1C is a cross-sectional view showing the light emitting device filament of FIG. 1A.

FIGS. 1A, 1B, and 1C are views showing a light emitting device filament according to an exemplary embodiment of the present disclosure, and FIGS. 1A, 1B, and 1C are respectively a perspective view, a plan view, and a cross-sectional view showing the light emitting device filament according to an exemplary embodiment of the present disclosure.

The light emitting device filament of the present disclosure is a light source in which a light emitting device is used as a component that emits a light and has an elongated string or line shape, i.e., a filament shape.

Referring to FIGS. 1A, 1B, and 1C, the light emitting device filament has a bar shape elongated in one direction. The light emitting device filament includes a substrate 10, at least one light emitting device chip 20 disposed on the substrate 10, and an auxiliary pattern 30 disposed on the substrate 10 to correspond to the light emitting device chip 20.

The substrate 10 is elongated in the one direction to form an overall shape of the light emitting device filament. The substrate 10 has a plate shape and includes a first surface 11a and a second surface 11b opposite to the first surface 11a, as shown in FIG. 1C. One or more light emitting device chips 20 are disposed on at least one surface of the first surface 11a and the second surface 11b.

Hereinafter, a structure in which the light emitting device chip 20 is disposed on the first surface 11a of both surfaces of the substrate 10 will be described as a representative example. In addition, the first surface 11a is referred to as an "upper surface", and the second surface 11b is referred to as a "lower surface". However, terms "upper and lower surfaces" will be described in consideration of directions relative to each other for convenience of description, and they may indicate different directions according to an arrangement of the light emitting device filaments.

The substrate 10 is flexible and includes an insulating material. The insulating substrate is flexible and may be formed of various materials, such as glass, polymer, etc. The substrate 10 may be an insulating substrate formed of an organic polymer. As the material for the insulating substrate, which includes the organic polymer, polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate may be used. However, the material for the substrate 10 should not be limited thereto or thereby. For example, the substrate 10 may include a fiber glass reinforced plastic (FRP).

In addition, in the exemplary embodiment of the present disclosure, the substrate 10 may include a conductive material as long as an adequate degree of flexibility and insulation may be achieved. When the conductive material is used for the substrate 10, the insulating material is applied to a surface of the substrate 10 to maintain an overall insulating property. When the substrate 10 includes the conductive material, a single metal of Al, Zn, Ag, W, Ti, Ni, Au, Mo, Pt, Pd, Cu, Cr or Fe, or an alloy thereof may be used.

In the exemplary embodiment of the present disclosure, a polyimide substrate may be used as the insulating substrate having flexibility.

At least one light emitting device chip 20 is disposed on the first surface 11a. The light emitting device chip 20 emits a light. The light emitted from the light emitting device chip 20 may be an ultraviolet light, an infrared light, or a visible light; however, it should not be particularly limited. In the exemplary embodiment of the present disclosure, the light emitting device chip 20 may emit the visible light. The structure of the light emitting device chip 20 will be described later.

The light emitting device chip 20 is disposed on the first surface 11a of the substrate. The light emitting device chip 20 may be provided in one or more numbers. The light emitting device chip 20 may be provided in various numbers in accordance with the area of the substrate.

The light emitting device chips 20 may be arranged in a line or matrix form on the substrate 10 along a longitudinal direction of the substrate 10. However, the arrangement of the light emitting device chips 20 should not be limited thereto or thereby, and the light emitting device chips 20 may be randomly arranged.

Each light emitting device chip 20 may emit lights having various colors. Each light emitting device chip 20 may be configured in a variety of forms as long as the light emitting device chip 20 emits the light. A light emitting diode according to an exemplary embodiment of the present disclosure may be used for the light emitting device chip 20.

Each light emitting device chip 20 may emit a white light and/or a color light. Each light emitting device chip 20 may emit one color, however, each light emitting device chip 20 may emit the white light and/or the color light by combining different colors. In the exemplary embodiment of the present disclosure, the light emitting device chip 20 may include a red light emitting device, a green light emitting device, and a blue light emitting device. However, the color emitted by the light emitting device chip 20 should not be limited thereto or thereby, and each light emitting device chip 20 may emit colors such as cyan, magenta, and yellow.

Although not shown in FIGS. 1A to 1C, the light emitting device chips 20 are connected to each other through a connection line or are individually connected to the connection line. The connection line provides a power to the light emitting device chip 20. Connection lines will be further described in connection with FIGS. 4A through 4C.

Electrode pads connected to the connection line are disposed at both end portions of the substrate 10. When the both end portions of the substrate are referred to as a "first end portion 13a" and a "second end portion 13b", respectively, first and second electrode pads 51a and 51b are disposed at the first and second end portions 13a and 13b, respectively.

The connection line electrically connects an electrode portion in the light emitting device chip 20 and the electrode pad or electrically connects the electrode portions to each other of the light emitting device chips 20. The connection line is configured in various ways to electrically connect the electrode pad and the light emitting device chip 20 depending on whether the light emitting device chips 20 are connected in series, connected in parallel, or connected in a combination of series and parallel.

In the exemplary embodiment of the present disclosure, the connection line and the first and second electrode pads 51a and 51b may be formed in the form of a plating film on the substrate.

Upper surfaces of the first and second electrode pads 51a and 51b are exposed and uncovered, and the first and second electrode pads 51a and 51b are connected to a line connection portion that provides the power, e.g., an insertion electrode terminal or a connector, to provide the power to the light emitting device chip 20. In the exemplary embodiment of the present disclosure, the first and second electrode pads 51a and 51b respectively disposed at the first and second end portions 13a and 13b may be connected to other line connection portions in various forms, e.g., by soldering or a connector, as long as the first and second electrode pads 51a and 51b are electrically connected to other line connection portions.

A first insulating layer 41 is disposed on the first surface 11a of the substrate 10 on which the light emitting device chip 20 and the connection line are disposed to cover the light emitting device chip 20. The first insulating layer 41 is not disposed on the first and second electrode pads 51a and 51b, as shown in FIGS. 1A through 1C. In some embodiments, the first insulating layer 41 may cover the light emitting device chip 20 from top to bottom and may protect the light emitting device chip 20.

In addition to protecting the light emitting device chip 20, the first insulating layer 41 may function as a light conversion layer that converts a wavelength of the light emitted from the light emitting device chip 20. When the first insulating layer 41 is used as the light conversion layer, the first insulating layer 41 may include a material that absorbs a specific wavelength and emits a light having a different wavelength, for example, nanoparticles or fluorescent materials. In the exemplary embodiment of the present disclosure, the first insulating layer 41 may include the fluorescent material as a light conversion material. When the first insulating layer 41 is not used as the light conversion layer, the first insulating layer 41 may include a transparent material to transmit the light emitted from the light emitting device chip 20 to the maximum.

In some embodiments, it is not necessary for each light emitting device chip 20 to employ green, red, and/or blue light emitting devices in order to implement the color, and a light emitting device chip 20 emitting a color other than the color described above may be used. In the present exemplary embodiment, as the first insulating layer 41 includes the fluorescent material, the insulating layer 41 may convert the wavelength of the light emitted from the light emitting device chip 20.

For example, a red light emitting diode may be used to implement the red color; however, the red light may be emitted by using a blue or ultraviolet light emitting diode with a fluorescent material that absorbs a blue light or ultraviolet light and then emits the red color. In the same manner, a green light emitting diode may be used to implement the green color; however, the green light may be emitted by using the blue or ultraviolet light emitting diode with a fluorescent material that absorbs the blue light or ultraviolet light and then emits the green color.

The first insulating layer 41 including the fluorescent material may be disposed on the substrate and may cover at least one light emitting device chip 20. In other words, the first insulating layer 41 may be provided to cover each light emitting device chip 20, or may be provided to cover two or more light emitting device chips 20. In the exemplary embodiment of the present disclosure, the first insulating layer 41 is provided to cover all of the light emitting device chips 20, but the present disclosure should not be limited thereto or thereby. The first insulating layer 41 may be provided in plural portions to be spaced apart from each other along an area of the upper surface of the substrate 10. For example, in a case where six light emitting device chips 20 are disposed on the substrate 10, the first insulating layer 41 may cover the entire six light emitting device chips 20, or the first insulating layer 41 may be separated into two portions each of which covers three light emitting device chips 20. When the first insulating layer 41 including the fluorescent material is provided in plural portions spaced apart from each other, each of the first insulating layers 41 may convert a specific light into lights of the same color, or alternatively, may convert the specific light into lights of different colors.

According to an exemplary embodiment of the present disclosure, if necessary, the first insulating layer 41 may be omitted and not be provided on the light emitting device chip 20. When the first insulating layer 41 is omitted on the light emitting device chip 20, a separate structure for protecting the light emitting device chip 20 may or may not be added. The shape of the first insulating layer 41 should not be limited thereto or thereby.

In an exemplary embodiment of the present disclosure, the first insulating layer 41 may be provided only on the upper surface of the substrate 10 as long as the first insulating layer 41 covers the light emitting device chip 20 and converts the color of the emitted light. As the first insulating layer 41 is provided on the upper surface of the substrate 10, in particular, only on a portion of the upper surface of the substrate 10, and a portion of a side surface of the substrate 10 are exposed to the outside, dissipation of heat through the substrate 10 may be easily performed. Accordingly, the light generated by the light emitting device chip 20 may be effectively removed, and thus, a defective rate of the light emitting device chip 20 may be reduced.

The auxiliary pattern 30 is provided on the second surface 11b of the substrate provided with each light emitting device chip 20 to correspond to the position where the light emitting device chip 20 is disposed. The auxiliary patterns 30 provided for each light emitting device chip 20 may be spaced apart from each other according to an arrangement position of the light emitting device chip 20.

The auxiliary pattern 30 reduces a warpage or a movement in an area corresponding to the light emitting device chip 20 of the substrate 10 when compared with other areas of the substrate, and thus, supports some areas of the substrate 10 in a stable manner.

The auxiliary pattern 30 may have a shape corresponding to the shape of each light emitting device chip 20 when viewed in a plan view. For example, when the light emitting device chip 20 has a rectangular shape, the auxiliary pattern 30 may also have the rectangular shape. When the light emitting device chip 20 has a circular shape, the auxiliary pattern 30 may also have the circular shape.

The auxiliary pattern 30 is provided on a lower surface of the substrate 10 corresponding to the area where the light emitting device chip 20 is provided, and thus, at least a portion of the auxiliary pattern 30 may overlap the light emitting device chip 20 when viewed in a plan view.

In the exemplary embodiment of the present disclosure, the auxiliary pattern 30 may have an area greater than that of the light emitting device chip 20. In this case, the light emitting device chip 20 may partially, or entirely overlap with the auxiliary pattern 30 when viewed in a plan view. For example, as shown in FIGS. 1B and 1C, when the light emitting device chip 20 is provided in the rectangular shape having a first width W1, the auxiliary pattern 30 may be provided in the rectangular shape having a second width W2 greater than the first width W1. In this case, the area of the auxiliary pattern 30 may be greater than the area of the light emitting device chip 20, and the light emitting device chip 20 may be disposed in the shape of the auxiliary pattern 30 when viewed in a plan view.

In the present exemplary embodiment, the area of the auxiliary pattern 30 may be set in consideration of a size of a conductive adhesive member 61 (see e.g., FIG. 7) provided when the light emitting device chip 20 is mounted on the first surface 11a of the substrate 10, for example, a size of a contact portion of a wiring line connected to the light emitting device chip 20 or a size of a solder as well as the size of the light emitting device chip 20 itself. As the auxiliary pattern 30 is provided to sufficiently include the wiring line or solder connected to the light emitting device chip 20 in terms of size, desorption of the wiring line or the solder may be prevented or reduced by the support by the auxiliary pattern 30.

The auxiliary pattern 30 controls the flexibility of the substrate 10 in an area where the auxiliary pattern 30 is provided and an area where the auxiliary pattern 30 is not provided. The auxiliary pattern 30 may include a material having a relatively higher hardness than the flexible substrate, and thus, the area provided with the auxiliary pattern 30 in the substrate 10 is less flexible than the area where the auxiliary pattern 30 is not provided. Therefore, when the light emitting device filament is bent, the area in which the auxiliary pattern 30 is formed is bent less than the area in which the auxiliary pattern 30 is not formed. Consequently, since a curvature of the surface of the substrate 10 on which the light emitting device chip 20 is provided is reduced, a probability that the light emitting device chip 20 is desorbed from the substrate is reduced.

The material of the auxiliary pattern 30 may be harder than the material of the substrate 10 and may be formed of a material different from that of the substrate 10. The material of the auxiliary pattern 30 may include a glass material, a polymer material, a metal material, a metal alloy, or the like. The material of the auxiliary pattern 30 may be selected from materials having the hardness greater than that of the material forming the substrate 10. For example, the metal material among the materials of the substrate 10 described earlier may be selected as the material of the auxiliary pattern 30.

A second insulating layer 43 may be provided on the second surface 11b on which the auxiliary pattern 30 is formed and may cover the auxiliary pattern 30.

The second insulating layer 43 may be provided on the second surface 11b corresponding to the area where the first insulating layer 41 is provided. For example, the second insulating layer 43 may have the same shape and area as those of the first insulating layer 41 and may be formed to overlap the first insulating layer 41. In addition, in some embodiments, when the first insulating layer 41 is provided in plural portions separated from each other, the second insulating layer 43 may also be provided in plural portions separated from each other. As the auxiliary pattern 30 is provided in substantially the same number and in the same shape as those of the light emitting device chip 20, the first and second insulating layers 41 and 43 covering the light emitting device chip 20 and the auxiliary pattern 30 may match, i.e., they are also provided in the same number and in the same shape. As the first insulating layer 41 and the second insulating layer 43 have substantially the same shape, stress may be applied to both surfaces of the substrate 10 to a similar extent even though the first surface 11a is bent in a convex or concave direction with respect to the substrate 10.

The second insulating layer 43 may or may not include the fluorescent material. When the light emitting device chip 20 is provided on the second surface 11b of the substrate, the second insulating layer 43 may include the fluorescent material and may be used as the light conversion layer. When the light emitting device chip 20 is not provided on the second surface 11b of the substrate, the second insulating layer 43 does not necessarily need to include the fluorescent material.

In the above-described embodiments, for the convenience of explanation, only the substrate 10, the light emitting device chip 20, the first and second electrode pads 51a and 51b, and the first and second insulating layers 41 and 43 are shown; however, other additional components may be further used. For example, an insulating adhesive layer may be further provided between the substrate 10 and the light emitting device chip 20 to attach the light emitting device chip 20 to the substrate 10. The connection line (not shown) may be disposed on the insulating adhesive layer, and a photo solder resist (PSR) may be further disposed between the connection line and the fluorescent material.

In the light emitting device filament having the above-described structure, even though the substrate 10 is bent, the hardness of the area where the light emitting device chip 20 is mounted is maintained relatively high by the auxiliary pattern 30, and the degree of warpage is reduced, thereby preventing or significantly reducing the light emitting device chip 20.

In the exemplary embodiment of the present disclosure, the shape of the auxiliary pattern 30 and the second insulating layer 43 may be changed in various ways. That is, the auxiliary pattern 30 and the second insulating layer 43 may have different shapes, for example, different areas or different thicknesses, depending on a direction in which the light emitting device filament is bent, a degree of bending of the light emitting device filament, and an adhesive strength of the light emitting device chip 20.

Figure 2A:
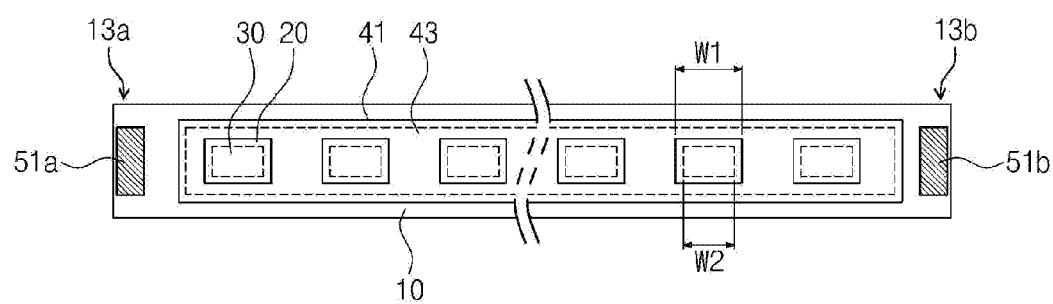
FIG. 2A is a plan view showing a lighting emitting device filament according to another embodiment of the present disclosure.
Figure 2B:
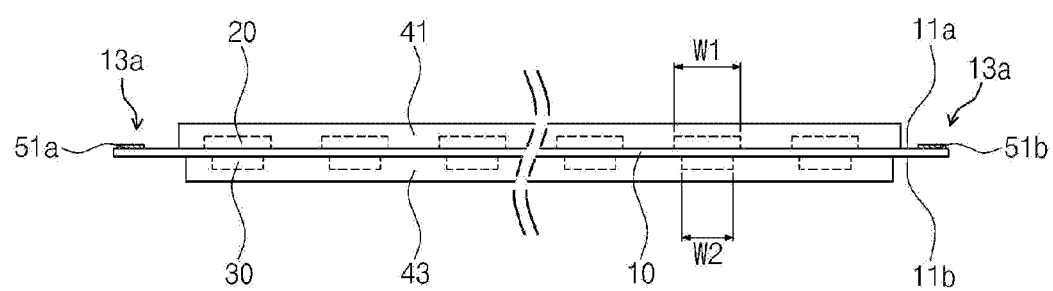
FIG. 2B is a cross-sectional view showing the lighting emitting device filament of FIG. 2A.

FIGS. 2A and 2B are respectively a plan view and a cross-sectional view showing a lighting emitting device filament according to another exemplary embodiment of the present disclosure. Hereinafter, different features from the above-described embodiments will be mainly described in order to avoid redundancy, and components not described are substantially the same as those in the above-described embodiment.

Referring to FIGS. 2A and 2B, an auxiliary pattern 30 may have an area equal to or smaller than a light emitting device chip 20. FIGS. 2A and 2B show the auxiliary pattern 30 having the area smaller than the light emitting device chip 20 as a representative example.

In this case, the light emitting device chip 20 may partially overlap the auxiliary pattern 30 when viewed in a plan view. For example, when the light emitting device chip 20 is provided in a rectangular shape having a first width W1, the auxiliary pattern 30 may be provided in the rectangular shape having a second width W2 smaller than the first width W1. In this case, the area of the auxiliary pattern 30 may be smaller than the area of the light emitting device chip 20, and the auxiliary pattern 30 may be disposed in the shape of the light emitting device chip 20 when viewed in a plan view.

In the present exemplary embodiment, the area of the auxiliary pattern 30 may be set in consideration of an attachment strength of the light emitting device chip 20 to the substrate 10, a degree of warpage of the substrate 10, a size of a contact portion of a wiring line connected to the light emitting device chip 20, or a size of a solder. When the degree of adhesion of the light emitting device chip 20 to the substrate 10 is not relatively small, the area of the auxiliary pattern 30 does not have to be larger than the light emitting device chip 20. In this case, the area where the auxiliary pattern 30 is formed and the area around the auxiliary pattern 30 are generally higher in hardness than the area where the auxiliary pattern 30 is not provided, and as a result, desorption of the wiring line or the solder may be prevented or reduced due to the support by the auxiliary pattern 30.

The light emitting device chip 20 according to the exemplary embodiment of the present disclosure may be implemented in various ways, and hereinafter, the structure of the light emitting device chip 20 will be described.

Figure 3A:
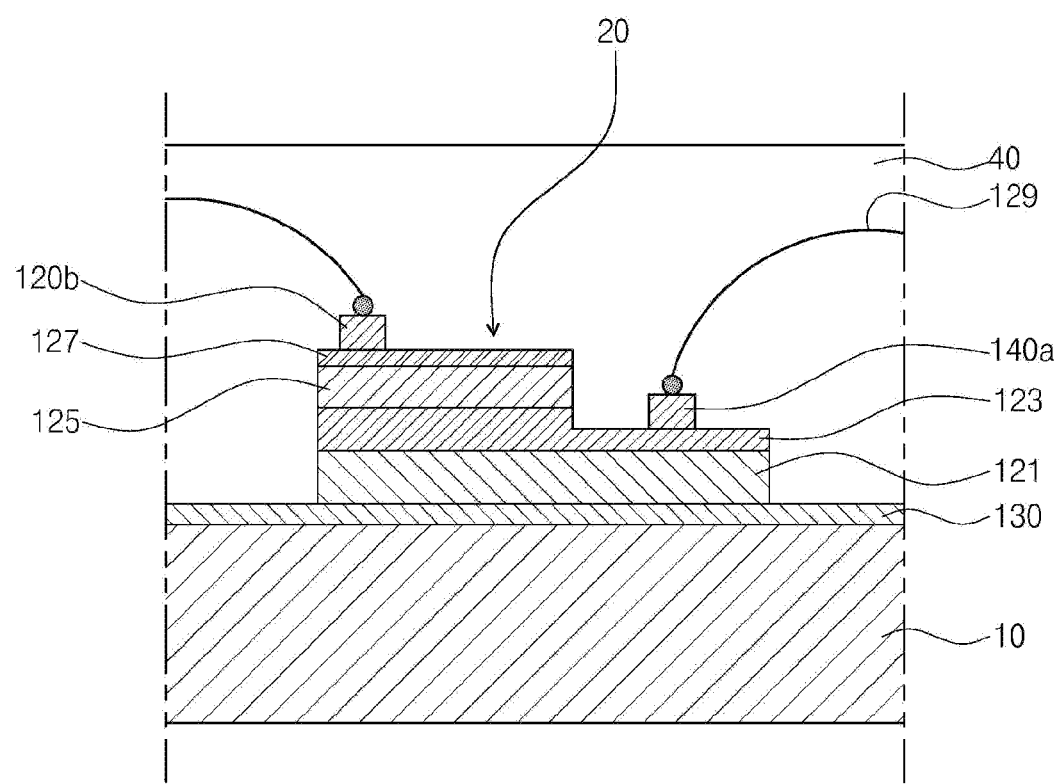
FIG. 3A is a cross-sectional view showing a light emitting device chip implementing a vertical-type light emitting diode according to an exemplary embodiment of the present disclosure.
Figure 3B:
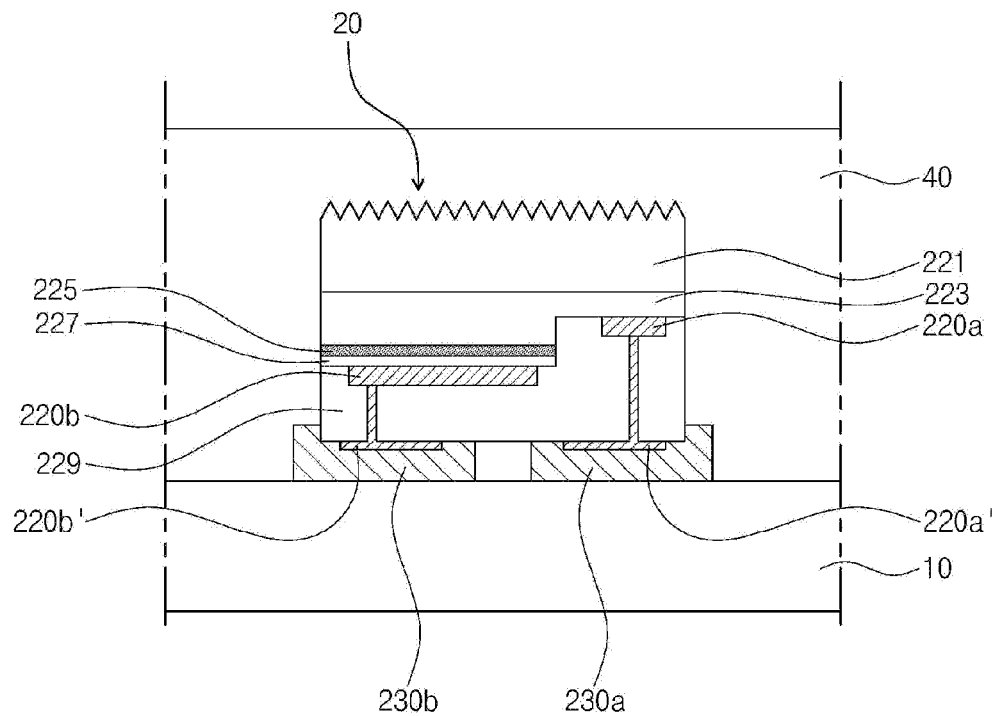
FIG. 3B is a cross-sectional view showing a light emitting device chip implementing a flip-type light emitting diode according to an exemplary embodiment of the present disclosure.

FIGS. 3A and 3B are cross-sectional views showing a light emitting device chip 20 implemented as a light emitting diode according to an exemplary embodiment of the present disclosure. The light emitting diode may be configured in various forms such as a vertical type, or a flip type. FIG. 3A shows the vertical-type light emitting diode, and FIG. 3B shows the flip-type light emitting diode. However, the structure of the light emitting diode should not be limited thereto or thereby, and the following drawings should be understood as embodiments of the present disclosure.

First, the vertical-type light emitting device chip 20 will be described with reference to FIG. 3A. The light emitting device chip 20 is provided on a first surface of a substrate with an insulating adhesive layer 130 interposed therebetween.

The light emitting device chip 20 may include a device substrate 121, a first conductive type semiconductor layer 123, an active layer 125, a second conductive type semiconductor layer 127, and first and second contact electrodes 140a and 140b.

The device substrate 121 is a growth substrate to grow a III-V nitride-based semiconductor layer, and may be, for example, a sapphire substrate, particularly a patterned sapphire substrate. The device substrate 121 is preferably an insulating substrate; however, it should not be limited to the insulating substrate.

The first conductive type semiconductor layer 123, the active layer 125, and the second conductive type semiconductor layer 127 are sequentially disposed on the device substrate 121. The first conductive type and the second conductive type have opposite polarities to each other. When the first conductive type is an n-type, the second conductive type is a p-type, and when the first conductive type is the p-type, the second conductive type is the n-type. In the exemplary embodiment of the present disclosure, a structure in which the n-type semiconductor layer, the active layer, and the p-type semiconductor layer are sequentially formed on the device substrate 121 will be described as a representative example.

The n-type semiconductor layer, the active layer, and the p-type semiconductor layer may be formed of a III-V nitride-based semiconductor, for example, a nitride-based semiconductor such as (Al, Ga, In) N. The n-type semiconductor layer, the active layer, and the p-type semiconductor layer may be formed by being grown on the substrate in a chamber using a known method such as a metal-organic chemical vapor deposition (MOCVD). In addition, the n-type semiconductor layer includes n-type impurities (e.g., Si, Ge, or Sn), and the p-type semiconductor layer includes p-type impurities (e.g., Mg, Sr, or Ba). For example, the n-type semiconductor layer may include GaN or AlGaN containing Si as a dopant, and the p-type semiconductor layer may include GaN or AlGaN containing Mg as a dopant. The n-type semiconductor layer and the p-type semiconductor layer are each shown as having a single-layer structure in the drawings, however, these layers may have a multi-layer structure and may also include a superlattice layer. The active layer may have a single quantum well structure, or a multi-quantum well structure, and a composition ratio of the nitride-based semiconductor is adjusted to emit a desired wavelength. For example, the active layer may emit a blue light or an ultraviolet light.

The first contact electrode 140a is disposed on the first conductive type semiconductor layer 123 on which the active layer 125 and the second conductive type semiconductor layer 127 are not provided, and the second contact electrode 140b is disposed on the second conductive type semiconductor layer 127.

The first and/or second contact electrodes 140a and 140b may have a single-layer, or multi-layer structure of metals. As the material of the first and/or second contact electrodes 140a and 140b, metals such as Al, Ti, Cr, Ni, Au, and alloys thereof may be used.

In the exemplary embodiment of the present disclosure, the light emitting device chip 20 is briefly described with reference to the drawings. However, in addition to the above-described layers, the light emitting device chip 20 may further include a layer having additional functions. For example, an electron blocking layer (not shown) may be disposed on the active layer 125. The electron blocking layer may be disposed between the active layer 125 and the second conductive type semiconductor layer 127 and may have a relatively high energy band gap to prevent electrons that are not combined with holes in the active layer from being diffused to the second conductive type semiconductor layer 127 disposed thereon. The electron blocking layer may include, for example, aluminum gallium nitride (AlGaN). Further, the light emitting device chip 20 may include various layers, such as a reflective layer for reflecting a light, an additional insulating layer for insulating a specific component, and a solder-preventing layer for preventing the solder from being diffused.

The first contact electrode 140a and/or the second contact electrode 140b are connected to a connection line 53 (see e.g., FIGS. 4A through 4C) described later through wiring lines. A first power and a second power are applied to the connection line 53. When the first power and the second power are applied to the first contact electrode and the second contact electrode through the wiring lines, the light emitting device chip 20 is driven to emit a light.

Then, the flip-type light emitting device chip 20 will be described with reference to FIG. 3B. The light emitting device chip 20 includes a light transmissive substrate 221, a first conductive type semiconductor layer 223, an active layer 225, a second conductive type semiconductor layer 227, a first contact electrode 220a, a second contact electrode 220b, an insulating layer 229, a first terminal 220a', and a second terminal 220b'.

In the present exemplary embodiment, the light transmissive substrate 221 may include a material that substantially simultaneously transmits, scatters, and disperses a light. For example, the light transmissive substrate 221 is a growth substrate to grow a glass or III-V nitride-based semiconductor layer, and may be, for example, a sapphire substrate, particularly a patterned sapphire substrate. The light transmissive substrate 221 is preferably an insulating substrate, however, it should not be limited to the insulating substrate.

A semiconductor layer is disposed on the light transmissive substrate 221. In an exemplary embodiment, in the case of a light emitting device that emits a green light, the semiconductor layer may include indium gallium nitride (InGaN), gallium nitride (GaN), gallium phosphide (GaP), aluminum gallium indium phosphide (AlGaInP), and aluminum gallium phosphide (AlGaP). In an exemplary embodiment, in the case of a light emitting device that emits a red light, the semiconductor layer may include aluminum gallium arsenide (AlGaAs), gallium arsenide phosphide (GaAsP), aluminum gallium indium phosphide (AlGaInP), and gallium phosphide (GaP). In an exemplary embodiment, in the case of a light emitting device emitting a blue light, the semiconductor layer may include gallium nitride (GaN), indium gallium nitride (InGaN), and zinc selenide (ZnSe).

The semiconductor layer includes the first conductive type semiconductor layer 223, the active layer 225, and the second conductive type semiconductor layer 227. The first conductive type and the second conductive type have opposite polarities to each other. When the first conductive type is an n-type, the second conductive type is a p-type, and when the first conductive type is the p-type, the second conductive type is the n-type. In the exemplary embodiment of the present disclosure, a structure in which the n-type semiconductor layer 223, the active layer 225, and the p-type semiconductor layer 227 are sequentially formed on the light transmissive substrate 221 will be described as a representative example.

The n-type semiconductor layer 223, the active layer 225, and the p-type semiconductor layer 227 may be formed of a III-V nitride-based semiconductor, for example, a nitride-based semiconductor such as (Al, Ga, In)N. The n-type semiconductor layer 223, the active layer 225, and the p-type semiconductor layer 227 may be formed by being grown on the light transmissive substrate 221 in a chamber using a known method such as a metal-organic chemical vapor deposition (MOCVD). In addition, the n-type semiconductor layer 223 includes n-type impurities (e.g., Si, Ge, or Sn), and the p-type semiconductor layer 227 includes p-type impurities (e.g., Mg, Sr, or Ba). For example, the n-type semiconductor layer 223 may include GaN or AlGaN containing Si as a dopant, and the p-type semiconductor layer 227 may include GaN or AlGaN containing Mg as a dopant.

The n-type semiconductor layer 223 and the p-type semiconductor layer 227 are each shown as having a single-layer structure in FIG. 3B; however, these layers may have a multi-layer structure and may also include a superlattice layer. The active layer 225 may have a single quantum well structure or a multi-quantum well structure, and a composition ratio of the nitride-based semiconductor is adjusted to emit a desired wavelength. For example, the active layer 225 may emit a blue light or an ultraviolet light.

The first contact electrode 220a is disposed on the first conductive type semiconductor layer 223 on which the active layer 225 and the second conductive type semiconductor layer 227 are not provided, and the second contact electrode 220b is disposed on the second conductive type semiconductor layer 227.

The first contact electrode 220a and/or the second contact electrode 220b may have a single-layer, or multi-layer structure of metals. As the material of the first contact electrode 220a and/or the second contact electrode 220b, metals such as Al, Ti, Cr, Ni, Au, and alloys thereof may be used.

The insulating layer 229 is disposed on the first and/or second contact electrodes 220a and 220b, and the first terminal 220a' connected to the first contact electrode 220a through a contact hole and the second terminal 220b' connected to the second contact electrode 220b through a contact hole are disposed on the insulating layer 229.

The first terminal 220a' may be connected to one connection electrode of a first connection electrode and a second connection electrode through a second conductive adhesive layer, and the second terminal 220b' may be connected to the other connection electrode of the first connection electrode and the second connection electrode through the second conductive adhesive layer.

The first terminal 220a' and/or the second terminal 220b' may have a single-layer or multi-layer structure of metals. As the material of the first terminal 220a' and/or the second terminal 220b', metals such as Al, Ti, Cr, Ni, Au, and alloys thereof may be used.

In the present exemplary embodiment, a plurality of protrusions may be provided on a rear surface of the light transmissive substrate 221 (that is, an opposite surface to the surface on which the active layer 225 is provided) to increase a light emission efficiency. The protrusions may be provided in various forms, such as a polygonal pyramid, a hemisphere, or a surface having a roughness, on which the protrusions are randomly arranged.

In the exemplary embodiment of the present disclosure, although the light emitting device is briefly described with reference to FIG. 3B, the light emitting device may further include a layer having additional functions in addition to the above-described layers. For example, the light emitting device may further include various layers, such as a reflective layer for reflecting a light, an additional insulating layer for insulating a specific component, and a solder-preventing layer for preventing the solder from being diffused.

In addition, when the flip-chip type light emitting device is formed, a mesa may be structured in various ways, and positions and shapes of the first and second contact electrodes 220a and 220b, or the first and second terminals 220a' and 220b' may be changed in various ways.

First and second solders 230a and 230b that are conductive are respectively provided on the first and second terminals 220a' and 220b', and the first and second terminals 220a' and 220b' are attached to the connection line 53 (see, FIGS. 4A to 4C) disposed on the substrate through the first and second solders 230a and 230b. The first power and the second power are applied to a connection line (not shown), and the first power and the second power are applied to the first contact electrode 220a and the second contact electrode 220b through the first and second solders 230a and 230b and the first and second terminals 220a' and 220b', thereby driving the light emitting device chip 20 and emitting the light.

As described above, since the flip-type and vertical-type light emitting device chips 20 are attached to the substrate through the solder or the insulating adhesive layer, the light emitting device chip 20 may be desorbed from the substrate according to the bending or movement of the substrate. However, when the auxiliary pattern 30 according to the exemplary embodiment of the present disclosure is provided, the hardness of the area where the light emitting device chip 20 is provided increases, and thus, the desorption of the light emitting device chip 20 may be prevented or reduced. In particular, in the case of the vertical-type light emitting device chip 20, the contact electrode and the connection electrode are in contact with each other through the wire. The wire is relatively vulnerable to disconnection than a flip chip. However, even in this case, the light emitting device chip 20 may be stably coupled to the substrate by the auxiliary pattern 30.

In the above-described embodiments, the vertical-type and flip-type light emitting device chips 20 are described in connection with FIGS. 3A and 3B. Apart from the structural differences, however, the two embodiments may be combined or compatible with each other in terms of materials or functions of components. In addition, the light emitting device chip 20 may have a structure other than the above described structure in FIGS. 3A and 3B and may be modified in various ways as long as it does not depart from the concept of the present disclosure.

In the light emitting device filament according to the exemplary embodiment of the present disclosure, the light emitting device chip 20 may be arranged in various forms, and a connection relationship between the light emitting device chip 20 and the connection line 53 may be changed in various ways.

Figure 4A:
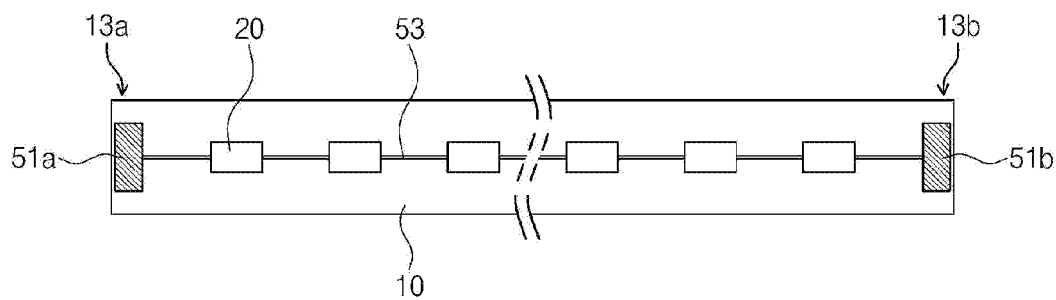
FIG. 4A is a plan view showing lighting emitting device chips arranged in a row on a substrate and having electrode pads at two ends according to embodiments of the present disclosure.
Figure 4B:
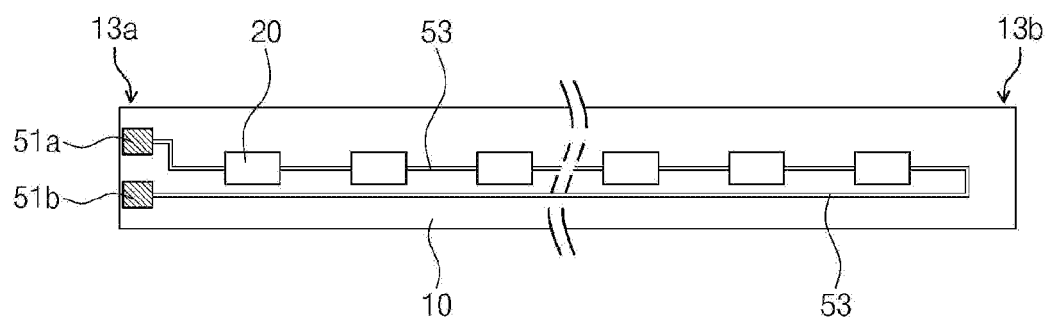
FIG. 4B is a plan view showing lighting emitting device chips arranged in a row on a substrate and having electrode pads at one end according to an embodiments of the present disclosure.
Figure 4C:
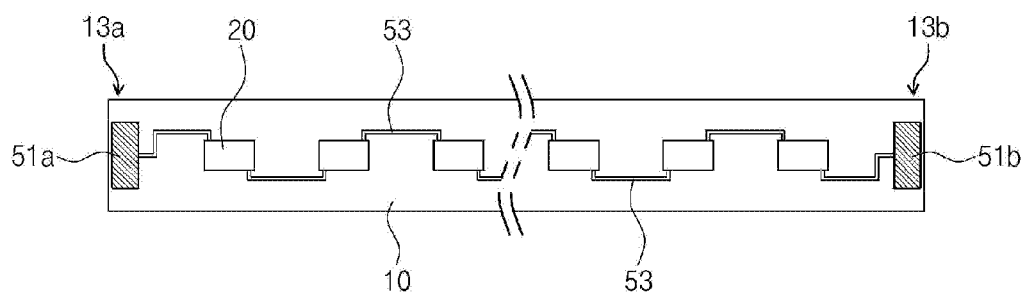
FIG. 4C is a plan view showing lighting emitting device chips arranged in a row on a substrate and having different connection lines according to embodiments of the present disclosure.

FIGS. 4A to 4C are plan views showing lighting emitting device chips 20 arranged in a row on a substrate according to an exemplary embodiment of the present disclosure.

Referring to FIG. 4A, in the light emitting device filament according to the exemplary embodiment of the present disclosure, plural light emitting device chips 20 may be provided, and the light emitting device chips 20 may be arranged in a row on the substrate. First and second electrode pads 51a and 51b are respectively disposed at both ends of the substrate, that is, a first end 13a and a second end 13b, and a connection line 53 connects the first electrode pad 51a of the first end 13a to the light emitting device chip 20, the light emitting device chip 20 to another light emitting device chip 20, and the light emitting device chip 20 to the second electrode pad 51b of the second end 13b. Through this, the light emitting device chips 20 may be connected to each other in series through the connection line 53.

In the present exemplary embodiment, although not shown in figures, the first electrode pad 51a is connected to one of two contact electrodes, for example, a first contact electrode, of a first adjacent light emitting device chip 20 through the connection line 53. A second contact electrode of the light emitting device is connected to a first contact electrode of a next adjacent light emitting device via the connection line 53. The light emitting device chips 20 are connected in the series connection method, and a second contact electrode of an outermost light emitting device chip 20 is connected to the second electrode pad 51b. As a positive power and a negative power are applied to the first electrode pad 51a and the second electrode pad 51b, respectively, the light emitting device chips 20 connected to the first electrode pad 51a and the second electrode pad 51b may be turned on.

Referring to FIG. 4B, first and second electrode pads 51a and 51b may not be provided at both first and second ends 13a and 13b, respectively. The first and second electrode pads 51a and 51b may be provided only at one end of the first and second ends 13a and 13b, and, in the present exemplary embodiment, the first and second electrode pads 51a and 51b are provided only at the first end 13a.

A structure for applying the power in the case where the first and second electrode pads 51a and 51b are provided at the first and second ends 13a and 13b, respectively, may be different from a structure for applying the power in the case where the first and second electrode pads 51a and 51b are provided only at one end of the first and second ends 13a and 13b. The arrangements of the electrode pads may be set in consideration of an overall shape of the light emitting device filament, a connection relationship with other components (in particular, an electrical connection relationship depending on whether a connector or additional wiring is required), and the like.

Referring to FIG. 4C, first and second electrode pads 51a and 51b may be respectively provided at first and second ends 13a and 13b as shown in FIG. 4A. However, in the present exemplary embodiment, a connection line 53 may have a feature that is bent at least once in a width direction of a substrate.

In the case of the light emitting device filament, it is common that the substrate is bent to be convexed or concaved in a direction perpendicular to a longitudinal direction. Accordingly, a tensile stress may be applied along a longitudinal direction of the connection line 53, and a possibility of disconnection of the connection line 53 increases. In addition, the tensile stress applied along the longitudinal direction may affect wires or solders and may lead to desorption of the light emitting device chip 20.

In the present exemplary embodiment, the connection line 53 may be bent in the width direction rather than the longitudinal direction of the substrate such that the stress applied to the connection line 53 is reduced. In the present exemplary embodiment, the connection line 53 is bent two times, however, the number of bending times should not be limited to two times, and the connection line 53 may be bent more than two times.

In addition, the connection line 53 may be formed in a direction inclined with respect to the longitudinal direction or the width direction to reduce the tensile stress applied to the connection line 53, the solder, and/or the wire. Further, the connection line 53 may have a curved line shape.

According to the exemplary embodiment of the present disclosure, due to the change in shape of the connection line 53, the desorption of the light emitting device chip 20 and the disconnection of the connection line 53 may be minimized.

In the light emitting device filament according to the exemplary embodiment of the present disclosure, the light emitting device chip 20 may be arranged to form a plurality of rows or columns in consideration of an amount of light to be emitted and a uniformity of light to be emitted. In other words, the light emitting device chips 20 may be arranged along a matrix, along a column, or along a row.

Figure 5A:
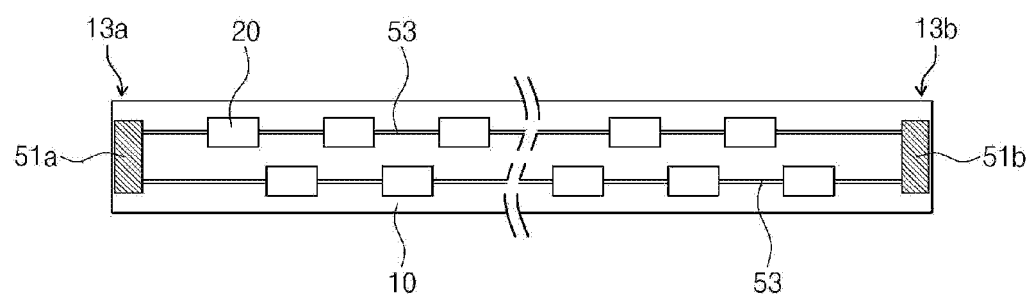
FIG. 5A is a plan view showing lighting emitting device chips arranged in two rows on a substrate according to embodiments of the present disclosure.
Figure 5B:
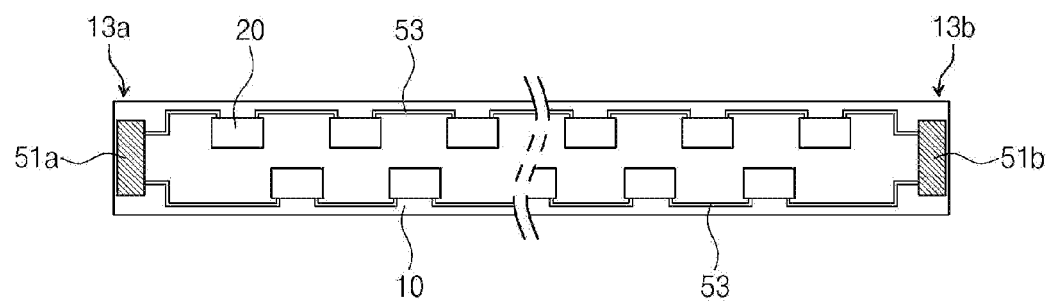
FIG. 5B is a plan view showing lighting emitting device chips arranged in two rows on a substrate as a curved line shape according to embodiments of the present disclosure.

FIGS. 5A and 5B are plan views showing lighting emitting device chips 20 arranged in two rows on a substrate according to an exemplary embodiment of the present disclosure.

Referring to FIGS. 5A and 5B, the light emitting device chips 20 provided in plural may be arranged along plural rows, for example, two, three, or more rows. The light emitting device chips 20 arranged along each row may be electrically connected in various forms and may be connected in series as shown in FIGS. 4A through 4C.

The connection line 53 connected between the light emitting device chips 20 may have a straight line shape as shown in FIG. 5A or a curved line shape as shown in FIG. 5B.

In the present exemplary embodiment, when the light emitting device chips 20 are arranged in plural rows along a longitudinal direction of the substrate, the light emitting device chips 20 may be arranged not to overlap each other in a width direction (column direction). That is, the light emitting device chips arranged in rows adjacent to each other may not be arranged on the same line along the width direction of the substrate and may be provided in a zigzag form along the longitudinal direction. As described above, the light emitting device chips 20 may be arranged so that the light emitting device chips 20 uniformly emit the light in a wide area as much as possible. Although not shown separately, the plural light emitting device chips may also be randomly arranged.

In the above-described embodiment, the light emitting device chips 20 are electrically connected in series to each other however, the exemplary embodiment of the present disclosure should not be limited thereto or thereby. For example, the light emitting device chips 20 may be electrically connected in parallel to each other.

Figure 6A:
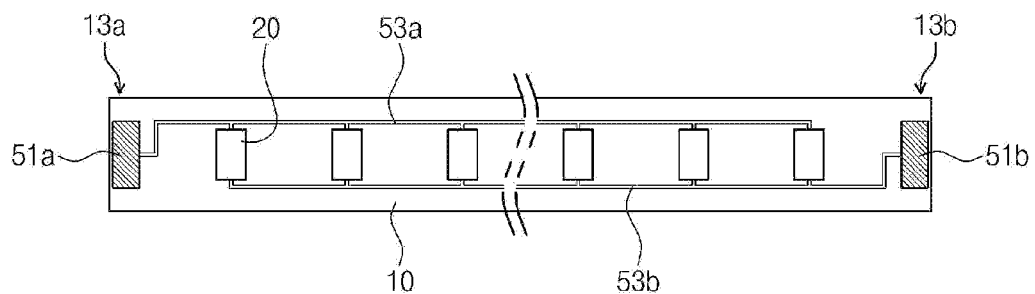
FIG. 6A is a plan view showing light emitting device chips connected to each other in parallel on a substrate according to embodiments of the present disclosure.
Figure 6B:
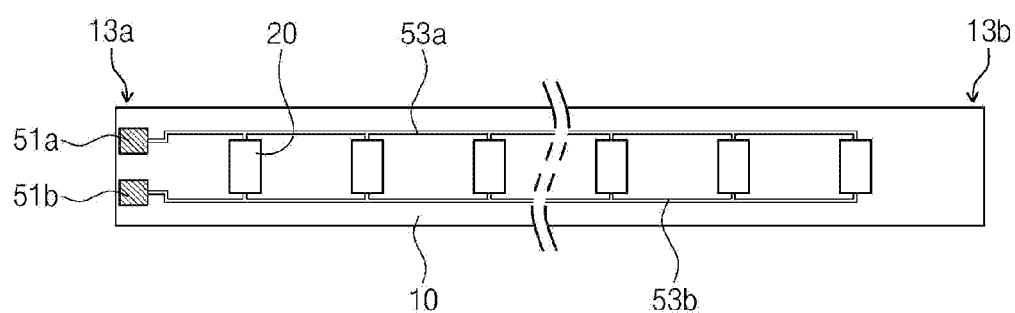
FIG. 6B is a plan view showing light emitting device chips connected to each other in parallel on a substrate and having electrode pads at one end according to embodiments of the present disclosure.
Figure 6C:
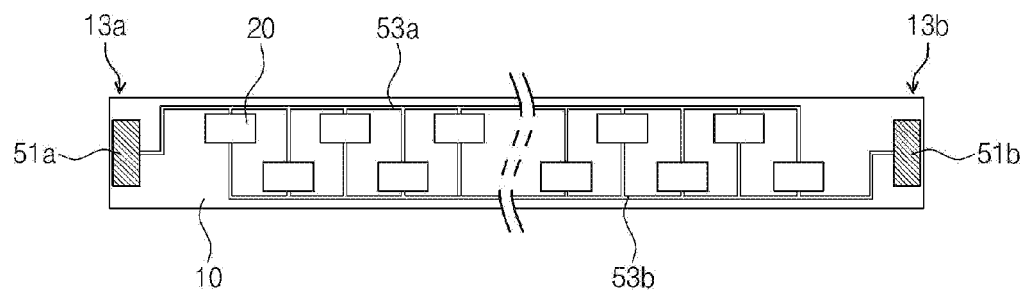
FIG. 6C is a plan view showing light emitting device chips connected to each other in parallel on a substrate in a zigzag form according to embodiments of the present disclosure.

FIGS. 6A to 6C are plan views showing light emitting device chips 20 connected to each other in parallel on a substrate according to an exemplary embodiment of the present disclosure.

Referring to FIG. 6A, in the light emitting device filament according to the exemplary embodiment of the present disclosure, the light emitting device chip 20 may be provided in plural, and the light emitting device chips 20 may be arranged in one row on the substrate. A first electrode pad 51a and a second electrode pad 51b are respectively disposed at both ends of the substrate, that is, a first end 13a and a second end 13b, and a first connection line 53a and a second connection line 53b are respectively connected to the first electrode pad 51a and the second electrode pad 51b. The first connection line 53a connects the first electrode pad 51a of the first end 13a and one contact electrode of first and second contact electrodes of the light emitting device chip 20, and the second connection line 53b connects the second electrode pad 51b of the second end 13b and the other contact electrode of the first and second contact electrodes of the light emitting device chip 20. Through this, the light emitting device chips 20 may be connected to each other in parallel through the first and second connection lines 53a and 53b. For example, the first electrode pad 51a is connected to the first contact electrode of each of the light emitting device chips 20, and the second electrode pad 51b is connected to the second contact electrode of each of the light emitting device chips 20. As a positive power and a negative power are applied to the first electrode pad 51a and the second electrode pad 51b, respectively, the light emitting device chips 20 connected to the first electrode pad 51a and the second electrode pad 51b may be turned on.

Referring to FIG. 6B, first and second electrode pads 51a and 51b may not be provided at first and second ends 13a and 13b, respectively. As shown in FIG. 6B, the first and second electrode pads 51a and 51b may be provided only at one end of the first and second ends 13a and 13b, and, in the present exemplary embodiment, the first and second electrode pads 51a and 51b are provided only at the first end 13a.

Referring to FIG. 6C, first and second electrode pads 51a and 51b may be respectively provided at first and second ends 13a and 13b as shown in FIG. 4A. However, in the present exemplary embodiment, the light emitting device chips 20 are arranged in a zigzag form. In this case, the light emitting device chips 20 may be arranged so that the light emitting device chips 20 uniformly emit the light in a wide area as much as possible.

As described above, when the light emitting device chip 20 according to the exemplary embodiment of the present disclosure is provided in plural, the light emitting device chips 20 may be arranged in various forms and may be electrically connected to each other in various ways. In the above-described exemplary embodiments, the light emitting device chips 20 are connected in series and in parallel, but the exemplary embodiment of the present disclosure should not be limited thereto or thereby, and the light emitting device chips 20 may be provided in a combination of a series and parallel connection. An amount of current consumed or a voltage applied may be set differently depending on the series connection, the parallel connection, or the combination of the series and parallel connection, and the combination of electrical connection relationship may be set by taking into account a field of application of the light emitting device filament, an amount of light, and a power consumption.

The light emitting device chips 20 and the first and second electrode pads 51a and 51b exposed to the outside as described above are provided separately and may be electrically connected to the first and second electrode pads 51a and 51b through the connection line 53. However, the light emitting device chips 20 may be attached to the exposed first and second electrode pads 51a and 51b using a conductive adhesive member 61, e.g., an anisotropic adhesive, a solder, etc.

Figure 7:
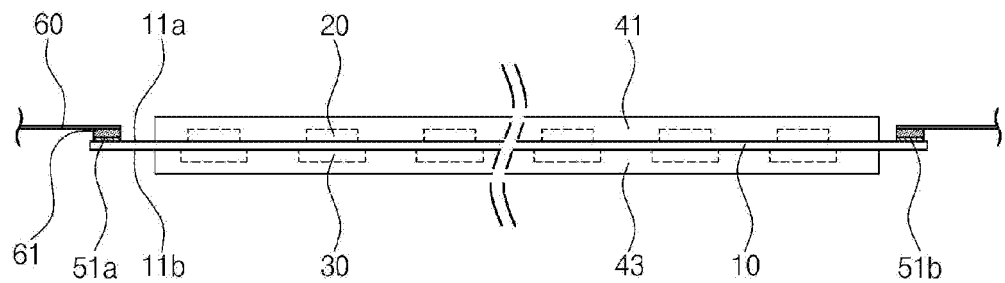
FIG. 7 is a cross-sectional view showing a light emitting device filament according to an exemplary embodiment of the present disclosure.

FIG. 7 is a cross-sectional view showing a light emitting device filament according to an exemplary embodiment of the present disclosure to show a structure in which an additional line 60 is directly attached to first and second electrode pads 51a and 51b. Referring to FIG. 7, a conductive adhesive member 61 is disposed on the first and second electrode pads 51a and 51b of first and second ends 13a and 13b, and the additional line 60 is connected to the first and second electrode pads 51a and 51b with the conductive adhesive member 61 interposed therebetween. The additional line 60 may have a variety of shapes, such as a wire shape or a plate shape. According to the present exemplary embodiment, an electrical connection with other components is facilitated through the additional line 60.

The light emitting device filament according to the embodiment of the present disclosure may be employed in various devices and used as a light source. The light emitting device filament may be used in various forms, for example, by being employed in indoor or outdoor lighting devices or automobile light sources (e.g., headlights, taillights, fog lights, indoor lights, etc.). In particular, the light emitting device filament may be employed in a bulb-type light source having the same shape as a conventional incandescent lamp and may emit a light as a filament therein. However, in the exemplary embodiment of the present disclosure, the light emitting device filament may be employed in various devices in addition to the above-described devices when a light source having a line or linear shape is required. In the following descriptions, an embodiment in which the light emitting device filament is used for the bulb-type light source will be described as a representative example.

FIGS. 8A to 8D are cross-sectional views showing a bulb-type light source employing a light emitting device filament according to an exemplary embodiment of the present disclosure.

Referring to FIGS. 8A to 8D, the bulb-type light source according to the exemplary embodiment of the present disclosure includes a globe 320 provided with an opening defined through one side thereof and formed of a transparent material transmitting a light, a light emitting device filament 100 disposed in the globe 320, a power board 330 connected to one end of the light emitting device filament 100, and a socket 340 coupled to the opening of the globe 320 and the power board 330.

The globe 320 has a spherical shape as a whole, however, the globe 320 has the opening through which the light emitting device filament 100 is inserted. The globe 320 may have a complete or incomplete spherical shape except for a portion corresponding to the opening, however, it should not be limited thereto or thereby. The globe 320 may have a variety of shapes, such as an elliptical shape or a shape in which a portion protrudes. The opening may vary depending on the shape of the globe 320 and may be provided in a circular or oval shape.

The globe 320 includes the transparent material to transmit a light emitting from the light emitting device filament 100. Here, the term "transparent" means that the globe 320 transmits at least a portion of the light emitted from the light emitting device filament 100 in the globe 320 and includes a case where the globe 320 transmits only a light having a specific wavelength or the globe 320 is translucent. To this end, the globe 320 may be formed of a transparent or translucent glass to transmit at least a portion of the light. However, a material for the globe 320 should not be limited thereto or thereby, and the globe 320 may be formed of a plastic material.

The light emitting device filament 100 is a filament-shaped component in which a light emitting device chip is mounted and includes a substrate and the light emitting device chip provided on the substrate.

The light emitting device filament 100 emits the light. The light emitted from the light emitting device filament 100 transmits through the globe 320 that is transparent and then travels to the outside of the globe 320.

The light emitting device filament 100 is inserted into the globe 320 through the opening of the globe 320. Since the light emitting device filament 100 may be provided in an elongated shape, the light emitting device filament 100 may be provided in a curved or bent shape along a longitudinal direction.

The light emitting device filament 100 may be provided in one or more numbers. The light emitting device filaments 100 may be provided in a greater number than the number of embodiments described above depending on a size or brightness of the bulb-type light source.

The socket 340 is engaged with the power board 330, and an engaging member is provided such that the socket 340 is mounted to an external device (e.g., an electrical outlet). The socket 340 may include a screw thread contact 341 which is engaged with the opening of the glass and an electrical foot contact 343 protruding downward, and the screw thread contact 341 and the electrical foot contact 343 may include a conductive material but may be insulated from each other. In this case, the screw thread contact 341 and the electrical foot contact 343 may be connected to an electrode pad of the light emitting device filament 100, and a power may be applied to the light emitting device filament 100 through the screw thread contact 341 and the electrical foot contact 343. However, the screw thread contact 341 and the electrical foot contact 343 are not necessarily formed of a conductive material in the case where the screw thread contact 341 and the electrical foot contact 343 are made to resemble an old bulb and are merely for aesthetic appearance. In this case, a power supply formed of a conductive material, such as a connector, may be provided separately in addition to the screw thread contact and the electrical foot contact.

In the exemplary embodiment of the present disclosure, assuming that a direction in which the socket 340 is inserted into the globe 320 is a central axis, the light emitting device filament 100 is engaged with the socket 340 and the power board 330 in a form extending substantially along the central axis. The light emitting device filament 100 may be bent and may have a curved shape so that a portion thereof is away from the central axis. That is, as shown in figures, the light emitting device filament may be disposed at a position relatively close to the central axis in one area and at a position relatively far from the central axis in another area.

Figure 8A:
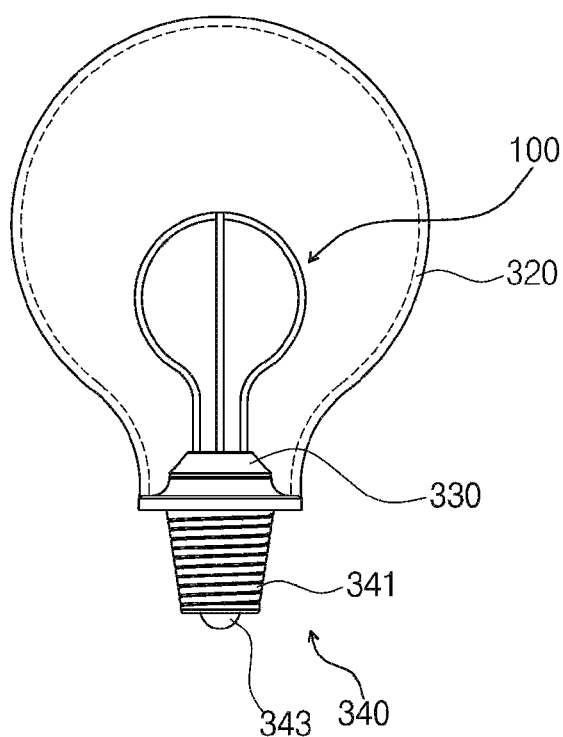
FIG. 8A is a cross-sectional view showing a bulb-type light source employing a first light emitting device filament according to embodiments of the present disclosure.
Figure 8B:
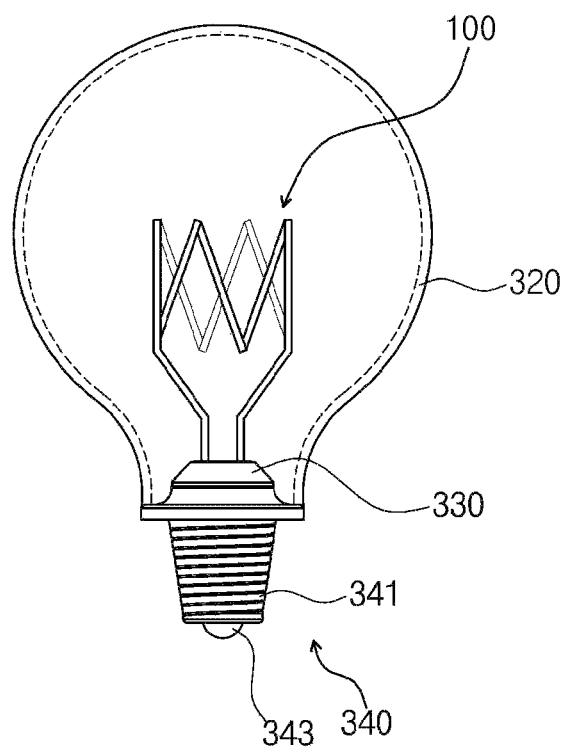
FIG. 8B is a cross-sectional view showing a bulb-type light source employing a second light emitting device filament according to embodiments of the present disclosure.
Figure 8C:
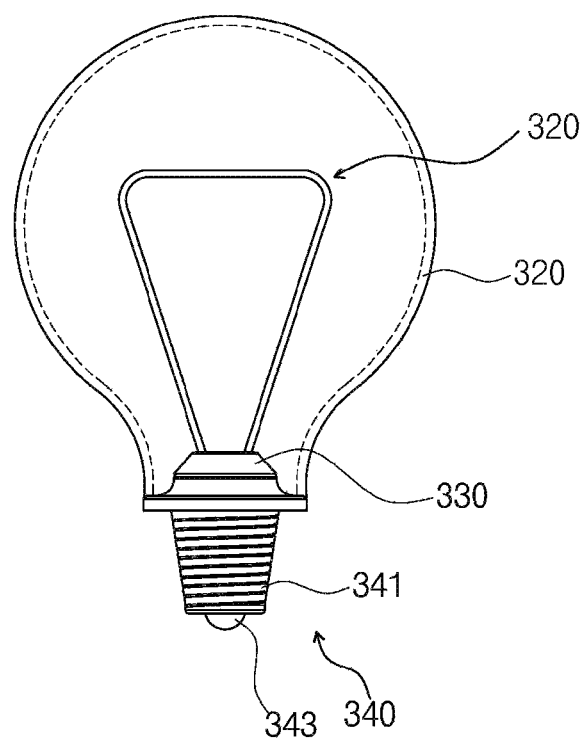
FIG. 8C is a cross-sectional view showing a bulb-type light source employing a third light emitting device filament according to embodiments of the present disclosure.
Figure 8D:
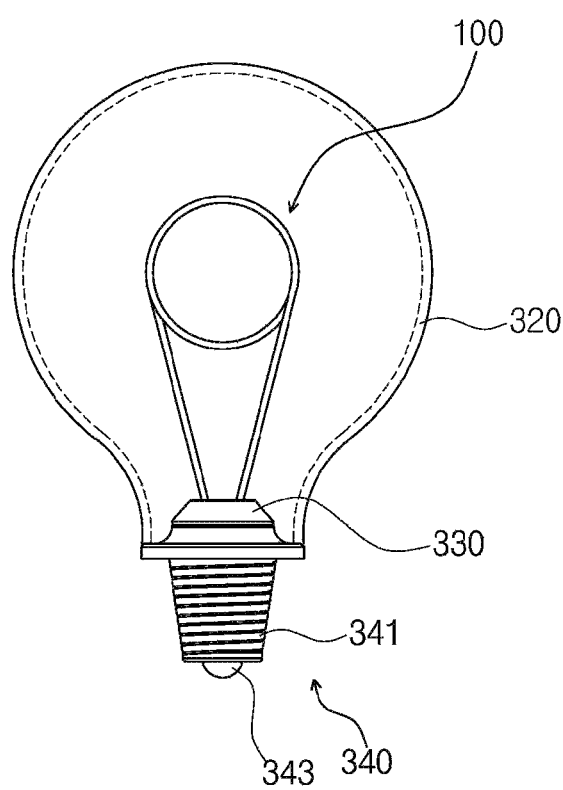
FIG. 8D is a cross-sectional view showing a bulb-type light source employing a fourth light emitting device filament according to embodiments of the present disclosure.

In the exemplary embodiment of the present disclosure, when the light emitting device filament 100 is provided in a plural number, the light emitting device filaments 120 may be disposed radially with respect to the central axis when viewed from a top perpendicular to the central axis, or the light emitting device filaments 140 may be provided in a straight line perpendicular to the central axis and may be provided in a shape twisted multiple times, as shown in FIGS. 8A through 8C.

Since the light emitting device filament may be bent in various directions, the bulb-type light source according to the exemplary embodiment of the present disclosure may emit the light such that the emitted light travels at a wide angle with respect to the central axis. That is, even when the light emitting device chip itself has a specific directivity angle, the substrate may be bent at a specific degree by using a flexibility of the substrate, and thus, the light emitted from the light emitting device may travel at various angles. For example, as a plurality of light emitting device chips having a predetermined directivity angle with respect to the central axis is arranged, the light may be emitted in 360 degrees in a direction perpendicular to the central axis and in 360 degrees in a horizontal direction to the central axis. Thus, in the case where the bulb-type light source according to the exemplary embodiment of the present disclosure is used, dark spots at specific angles and locations may be minimized.

Although the exemplary embodiments of the present disclosure have been described, it is understood that the present disclosure should not be limited to these exemplary embodiments but various changes and modifications can be made by one ordinary skilled in the art within the spirit and scope of the present disclosure as hereinafter claimed.

Therefore, the disclosed subject matter should not be limited to any single embodiment described herein, and the scope of the present inventive concept shall be determined according to the attached claims.

According to the exemplary embodiment of the present disclosure, the light emitting device filament in which the desorption of the light emitting device is prevented or reduced is provided.

The invention claimed is:

1. A light emitting device filament, comprising:
a substrate comprising a first surface and a second surface opposite to the first surface and extending in one direction;
at least one light emitting device chip disposed on the first surface;
an electrode pad disposed at at least one end of both ends of the substrate;
a connection line connecting the light emitting device chip and the electrode pad;
an auxiliary pattern disposed on the second surface and disposed at a position corresponding to the light emitting device chip; and
a first insulating layer disposed on the first surface and covering the light emitting device chip.

2. The light emitting device filament of claim 1, wherein the substrate has a flexibility.

3. The light emitting device filament of claim 2, wherein the auxiliary pattern has a hardness greater than the hardness of the substrate.

4. The light emitting device filament of claim 3, wherein the substrate and the auxiliary pattern comprise a polymer, a metal, or a metal alloy.

5. The light emitting device filament of claim 2, wherein the light emitting device chip overlaps the auxiliary pattern when viewed in a plane.

6. The light emitting device filament of claim 5, wherein the auxiliary pattern has an area equal to, or greater than an area of the light emitting device chip when viewed in a plane.

7. The light emitting device filament of claim 5, wherein the auxiliary pattern has an area smaller than an area of the light emitting device chip when viewed in a plane.

8. The light emitting device filament of claim 1, wherein the first insulating layer is a light conversion layer that converts a wavelength of a light emitted from the light emitting device chip.

9. The light emitting device filament of claim 8, wherein the light conversion layer comprises a fluorescent material.

10. The light emitting device filament of claim 1, further comprising a second insulating layer disposed on the second surface and covering the auxiliary pattern.

11. The light emitting device filament of claim 1, wherein the light emitting device chip comprises plural light emitting device chips.

12. The light emitting device filament of claim 11, wherein the plural light emitting device chips are arranged in at least one row and side by side along a longitudinal direction of the substrate.

13. The light emitting device filament of claim 12, wherein, when the light emitting device chips are arranged in plural rows along the longitudinal direction of the substrate, the light emitting device chips do not overlap each other in a width direction.

14. The light emitting device filament of claim 11, wherein the connection line is bent at least once.

15. The light emitting device filament of claim 11, wherein the light emitting device chips are connected to each other in series, or in parallel.

16. The light emitting device filament of claim 11, wherein at least some of the light emitting device chips are connected in series, and the other light emitting device chips are connected in parallel.

17. The light emitting device filament of claim 11, wherein the electrode pad is disposed on the first surface.

18. The light emitting device filament of claim 17, further comprising an additional line connected to the electrode pad by a conductive adhesive.

19. The light emitting device filament of claim 1, wherein the light emitting device chip is a flip chip type.

20. The light emitting device filament of claim 19, wherein the light emitting device chip comprises:
a device substrate;
a light emitting device disposed on the device substrate; and
a contact electrode disposed on the light emitting device, and the device substrate is a light transmissive substrate that scatters or disperses a light from the light emitting device.

21. The light emitting device filament of claim 20, wherein the device substrate comprises a patterned sapphire substrate.

22. A bulb-type light source, comprising:
a transparent globe; and
at least one light emitting device filament disposed in the globe, the light emitting device filament comprising:
a substrate comprising a first surface and a second surface opposite to the first surface and extending in one direction;
at least one light emitting device chip disposed on the first surface;
first and second electrode pads respectively disposed at both ends of the substrate;
a connection line connecting the light emitting device chip and the first and second electrode pads;
an auxiliary pattern disposed on the second surface and disposed at a position corresponding to the light emitting device chip; and
a first insulating layer disposed on the first surface and covering the light emitting device chip.

* * * * *